United States Patent [19]

Mathews et al.

[11] Patent Number: 5,259,924
[45] Date of Patent: Nov. 9, 1993

[54] INTEGRATED CIRCUIT FABRICATION PROCESS TO REDUCE CRITICAL DIMENSION LOSS DURING ETCHING

[75] Inventors: Viju K. Mathews; Ardavan Niroomand; Guy T. Blalock; Pierre C. Fazan, all of Boise, Id.

[73] Assignee: MICRON Technology, Inc., Boise, Id.

[21] Appl. No.: 865,087

[22] Filed: Apr. 8, 1992

[51] Int. Cl.$^5$ .......................................... H01L 21/306
[52] U.S. Cl. .................................... 156/653; 156/643; 156/651; 156/652
[58] Field of Search ................ 156/643, 653, 651, 652

[56] References Cited

U.S. PATENT DOCUMENTS

| | | | |
|---|---|---|---|
| 4,490,209 | 12/1984 | Hartman | 156/662 |
| 4,502,915 | 3/1985 | Carter et al. | 156/657 |
| 4,541,167 | 9/1985 | Havemann et al. | 29/576 |
| 4,568,410 | 2/1986 | Thornquist | 156/643 |
| 5,087,519 | 2/1992 | Teng | 156/643 |

FOREIGN PATENT DOCUMENTS 0207076  9/1986  Japan .

Primary Examiner—Brian E. Hearn
Assistant Examiner—Trung Dang
Attorney, Agent, or Firm—Dorr, Carson, Sloan & Peterson

[57] ABSTRACT

A pad oxide is formed on a silicon substrate followed by a layer of polysilicon about 100 Å thick. A silicon nitride layer is formed over said polysilicon layer then patterned with a first, fluorine-based, etch process to expose selected areas of the polysilicon layer. Then the exposed areas of polysilicon are removed using a second, chlorine-based, etch process fundamentally different from the first etch process. The high selectivity of the first etch process for nitride combined with the high selectivity of the second etch process for oxide, results in negligible CD loss in the overall process.

9 Claims, 2 Drawing Sheets

INTEGRATED CIRCUIT FABRICATION PROCESS TO REDUCE CRITICAL DIMENSION LOSS DURING ETCHING

BACKGROUND OF THE INVENTION

1. Field of the Invention

The invention in general relates to the fabrication of integrated circuits and more particularly to an apparatus and method for reducing critical dimension loss during etching at the interface of two materials that belong to the same etch chemistry class.

2. Statement of the Problem

As is well-known, integrated circuits, sometimes called semiconductor devices, are generally mass produced by fabricating hundreds of identical circuit patterns on a single semiconducting wafer, which wafer is subsequently sawed into hundreds of identical dice or chips. While integrated circuits are commonly referred to as "semiconductor devices" they are in fact fabricated from various materials which are either electrically conductive, electrically nonconductive, or electrically semiconductive. Silicon, the most commonly used semiconductor material, can be used in either the single crystal or polycrystalline form. In the integrated circuit fabrication art, polycrystalline silicon is usually called "polysilicon" or simply "poly", and shall be referred to as such herein. Both forms of silicon may be made conductive by adding impurities to it, which is commonly referred to as "doping". If the doping is with an element such as boron which has one less valence electron than silicon, electron "holes" become the dominant charge carrier and the doped silicon is referred to as P-type silicon. If the doping is with an element such as phosphorus which has one more valence electron than silicon, additional electrons become the dominant charge carriers and the doped silicon is referred to as N-type silicon. Silicon dioxide is also commonly used in integrated circuits as an insulator or dielectric. Its use is so common that in the art is generally referred to as "oxide" without ambiguity.

Integrated circuit fabrication may begin with a lightly-doped P-type silicon substrate, a lightly-doped N-type silicon substrate, or lightly-doped epitaxial silicon (deposited crystalline silicon) on a heavily doped substrate. For the sake of simplicity, the invention will be described using lightly-doped P-type silicon as the starting material, although it may be implemented with other materials as the starting point. If other materials are used as the starting point, there may be differences in materials and structure as is well-known in the art, e.g. with N-type silicon as the starting point dopant types may be reversed, or P-type wells may be introduced.

An integrated circuit will generally have areas of electrical activity, referred to as active areas or AA's, separated by silicon oxide insulating areas, generally referred to as field oxide regions. In the fabrication of many integrated circuit devices, such as memory arrays, a thin protective layer of silicon dioxide, called the pad oxide, is formed on the surface of the substrate, then the field oxide regions are formed to electrically isolate the future active areas from one another.

The process of defining the AA's and forming the field oxide regions has developed into a specialized technology sometimes referred to as LOCOS (LOCalized Oxidation of Silicon). The LOCOS technology comprises depositing a silicon nitride layer over the pad oxide, then using a mask and etch process to define the AA's. This mask and etch process is a well-known semiconductor fabrication process involving the following steps: a photo mask containing the pattern of the AA's to be fabricated is created; the silicon nitride layer is coated with a light-sensitive material called photoresist or resist; the resist-coated wafer is exposed to ultraviolet light through the mask to soften or harden parts of the resist depending on whether positive or negative resist is used; the softened parts of the resist are removed; the silicon nitride is etched to remove the part unprotected by the resist; and the remaining resist is stripped. The silicon nitride remaining after this process defines and protects the AA's from being oxidized during the formation of the field oxide regions.

The step of etching the silicon nitride presents serious technical problems in the standard LOCOS process. In etching the silicon nitride, it is important that the etch stops on the pad oxide layer, otherwise the silicon substrate below may be damaged. However, silicon nitride and silicon oxide are in the same etch chemistry class; i.e each are etchable by the same basic chemistry, e.g. fluorine chemistry is generally used to etch the silicon nitride. The conventional solution to this problem is to add large amounts of oxygen to the etch. The more oxygen in the etch, the more selective the etch is to silicon oxide. Here, the word "selective" means that the etch does not etch the silicon oxide but rather stops on the oxide. However, this results in a further problem. The use of large amounts of oxygen in the nitride etch process results in very rapid isotropic removal rate of the photoresist mask layer. As the resist mask is laterally etched, it exposes more and more of the silicon nitride. See FIG. 1. This results in critical dimension loss, often referred to as CD loss. That is, the critical dimension, the width X of the gap defined by the resist layer is lost. This CD loss can amount to 0.1 to 0.15 microns.

The advantages of building integrated circuits with smaller individual circuit elements so that more and more circuitry may be packed on a single chip are well-known: electronic equipment becomes less bulky, reliability is improved by reducing the number of solder or plug connections, assembly and packaging costs are minimized, and improved circuit performance, in particular higher clock speed, is achieved. However, the smaller the size, of the individual circuit elements, the more significant that CD loss becomes. In the current generation of DRAM under development, 64 MBit DRAM, the density has become such that the CD loss in the nitride etch process has become a very significant problem leading to defective devices. Thus there is a need for an etch process that minimizes or does not produce CD loss during etching at the interface of two materials of the same etch class, as in the etch of silicon nitride at an oxide interface.

It has been discovered, which discovery is part of the invention to be described below, that the CD loss can be minimized by a known process, called the poly buffered LOCOS (PBL) process. The PBL process addresses a problem that develops in the above-described LOCOS process, caused by the fact that the pad oxide is reactive in the field oxide formation process and can permit encroachment of field oxide under the nitride layer and into the AA. The thinner the pad oxide, the less this encroachment. However, the pad oxide is subject to stresses from the nitride layer, and if it is made too thin, the high stress level can result in significant damage to the silicon substrate beneath. In the PBL variation of the LOCOS process a polysilicon film is deposited between the pad oxide and the silicon nitride depositions. See U.S. Pat. No. 4,541,167 issued to Robert H. Havemann. The poly film reduces stress between the oxide and the silicon nitride, permitting a thinner pad oxide layer and thus reducing encroachment of the field oxide into the AA's. As described in U.S. Pat. No. 4,541,167, referred to above, the polysilicon film in the PBL process must be at least 500 Å thick, otherwise it will not be sufficient to provide the stress-relief function. However, such a thick polysilicon layer, requires considerable etching to remove after the field oxide layers are created. Further, since polysilicon is a common material used in integrated device structures, etching of such a thick layer of polysilicon requires careful attention to the design of the fabrication process so that desired polysilicon is not etched. Further, in many integrated circuit designs, especially in the very dense circuits, the CD loss problem is much more significant than the encroachment problem. Thus there is a need for a process that solves the CD loss problem, but does not use large thicknesses of polysilicon under the nitride.

SOLUTION TO THE PROBLEM

The present invention solves the above problems by adding a thin layer of polysilicon between the oxide and the nitride to the conventional LOCOS process. The layer of polysilicon is less than 300 Å, and preferably about 100 Å. Two fundamentally different etches are then used to expose the oxide; a first fluorine-based etch removes the nitride and is highly selective to the polysilicon; a second chlorine-based etch then removes the polysilicon and is highly selective to the oxide. The minimum thickness of the polysilicon layer is limited only by the selectivity of the nitride etch for polysilicon, which selectivity is extremely high due to the fundamentally different etch chemistries of the two materials, and thus the polysilicon can be very thin. Further, improving the selectivity of the nitride etch for polysilicon can reduce the minimum thickness of the polysilicon film to significantly less than 100 Å.

SUMMARY OF THE INVENTION

The invention provides an integrated circuit fabrication process comprising the steps of: providing a layer of a first material; forming a layer of a second material having a fundamentally different etch chemistry from the first material; forming a layer of a third material having an etch chemistry similar to the etch chemistry of the first material; patterning the third material using a first etch process to remove portions of the third material to expose selected areas of the second material; removing the exposed areas of the second material using a second etch process having an etch chemistry fundamentally different from the chemistry of the first etch process. Preferably, the layer of second material has a minimum thickness determined only by the selectivity of the first etch process to the second material. Preferably, the second material has a thickness of less than 300 Å. Preferably, the first material is silicon dioxide, the second material is polysilicon, and the third material is a silicon nitride. Preferably the first etch process is a fluorine-based etch process and the second etch process is a chlorine-based etch process.

The method of integrated circuit fabrication according to the invention not only permits a much thinner polysilicon layer than in the conventional PBL process, but also because of the higher selectivity of the second etch for oxide, thinner oxide layer can be used with less chance of damaging the silicon substrate. Numerous other features, objects and advantages of the invention will become apparent from the following description when read in conjunction with the accompanying drawings.

DESCRIPTION OF THE PREFERRED EMBODIMENT

1. Overview

Figure 1:
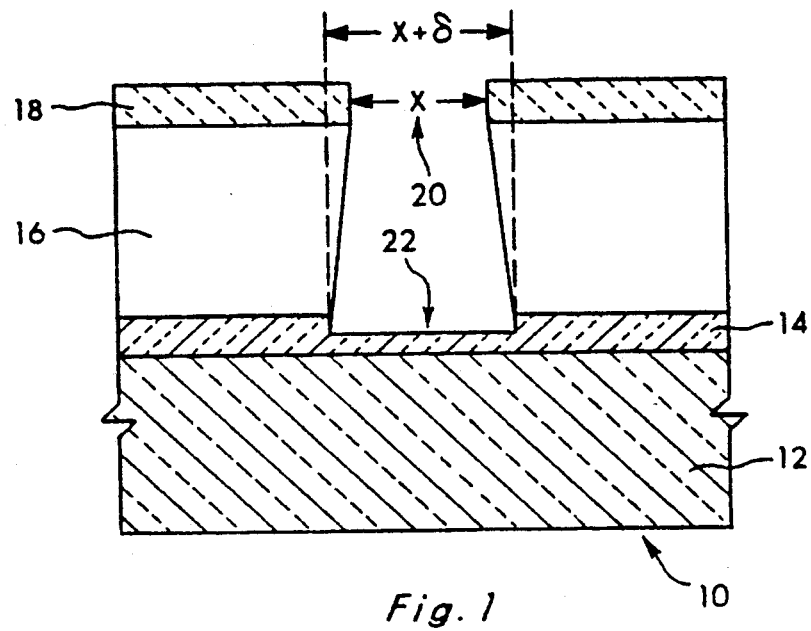
FIG. 1 is a cross-sectional view of a portion of a semiconductor device wafer according to the prior art LOCOS process showing how CD loss occurs.
Figure 2:
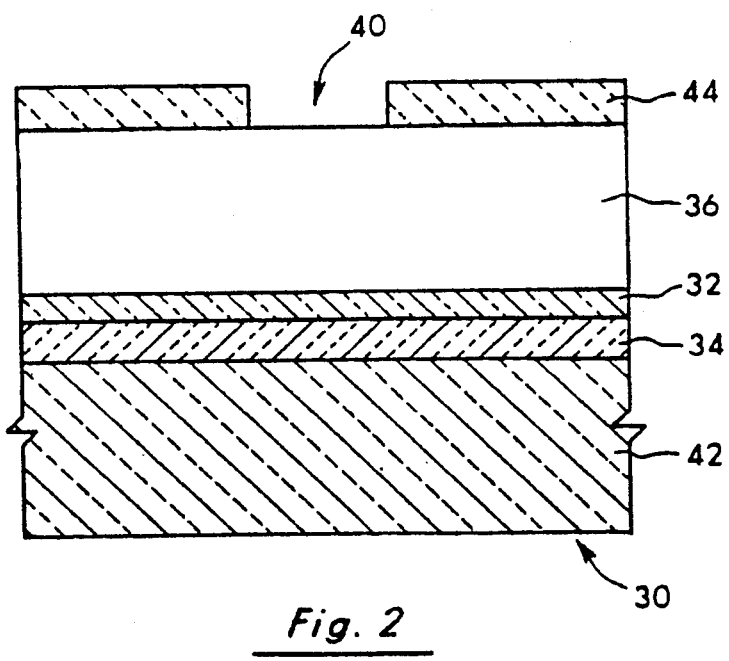
FIG. 2 is a cross-sectional view of the portion of the semiconductor device wafer according to the preferred embodiment of the invention just prior to the nitride etch.

Turning now to FIG. 1, a cross-sectional view of a portion of a semiconductor wafer 10 according to the prior art LOCOS process is shown. Wafer 10 includes a lightly-doped P-type silicon substrate 12, a pad oxide layer 14, a nitride layer 16, and a patterned resist layer 18. The resist has been removed in an area 20 of critical dimension X to permit the field oxide to be created in this area. The nitride has been etched with an etch selective to silicon dioxide with the result that the area 22 of width X+δ has been created to define the field oxide. Thus there has been a critical dimension loss of δ, which in the embodiment shown is between 0.10 μm to 0.15 μm. This can be highly damaging in the narrow dimensions required for high density DRAM's, for example 64 MBit DRAMS. In the process according to the invention (FIG. 2), a thin polysilicon film 32 is deposited between the oxide layer 34 and the nitride layer 36. An nitride etch selective to polysilicon is used to remove the nitride (FIG. 3), then a polysilicon etch selective to silicon dioxide is used to remove the unprotected poly layer 32 (FIG. 4) with no significant CD loss. The result is that the exposed area 38 which defines the field oxide in subsequent conventional steps (not shown) has essentially the same dimensions as the resist free area 40.

2. Detailed Description of the Fabrication

Returning now to FIG. 2, semiconductor wafer 30 according to the preferred embodiment of the invention prior to the nitride etch is shown. It should be understood that the figures are not meant to be actual cross-sectional views of any particular portion of an actual semiconducting device, but are merely idealized representations which are employed to more clearly and fully depict the process of the invention than would otherwise be possible. Wafer 30 includes silicon substrate 42, preferably lightly-doped P-type, a layer of a first material 34, preferably silicon oxide, a layer of a second material 32 having a fundamentally different etch chemistry from the first material, preferably a thin polysilicon layer about 100 Å thick, a layer of a third material 36 having an etch chemistry similar to the etch chemistry of the first material, preferably silicon nitride ($Si_3N_4$), and photoresist layer 44. The photoresist has been removed in the area 40 which defines the future field oxide regions.

Figure 3:
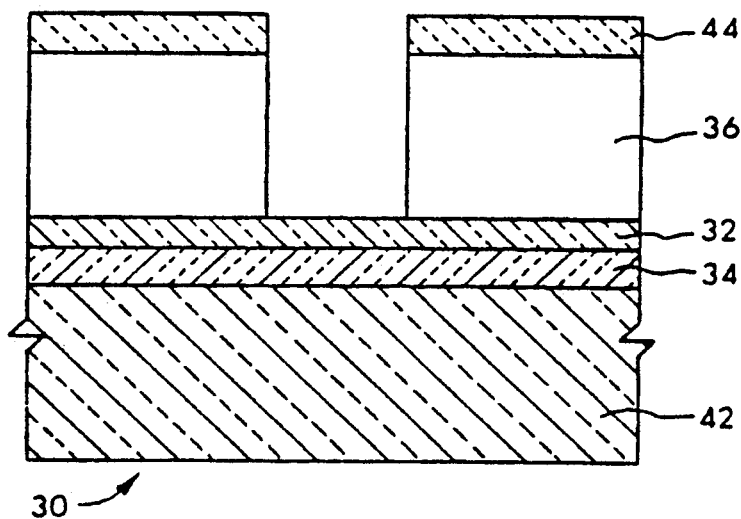
FIG. 3 is a cross-sectional view of the semiconductor device of FIG. 2 after the nitride etch.

Turning now to FIG. 3, the wafer 30 is etched using a first etch process, preferably a conventional anisotropic silicon nitride etch process such as a plasma-enhanced fluorine dry etch. In the prior art LOCOS process a highly oxygenated fluorine plasma is used because such a plasma is selective to silicon oxide. The highly oxygenated fluorine plasma of the prior art increases isotropy of the etch and leads to CD loss. In other words, in the process according to the present invention, a highly oxygenated fluorine plasma is not required, allowing the first etch process to be highly anisotropic as shown in FIG. 3. However, any etch that etches silicon nitride also etches silicon oxide to some extent since both silicon nitride and silicon oxide have similar fundamental etches. That is, the preferred etches for both materials are based on the same chemistry, i.e. fluorine chemistry. Thus a significant amount of etching of the oxide at the nitride-oxide interface, cannot be eliminated. This leads to CD loss. However, in the process according to the invention, preferably a fluorine-based plasma-enhanced dry etch is used, specifically freon-based chemistries such as $CF_4$ and $CF_3$, which are highly selective to polysilicon.

Figure 4:
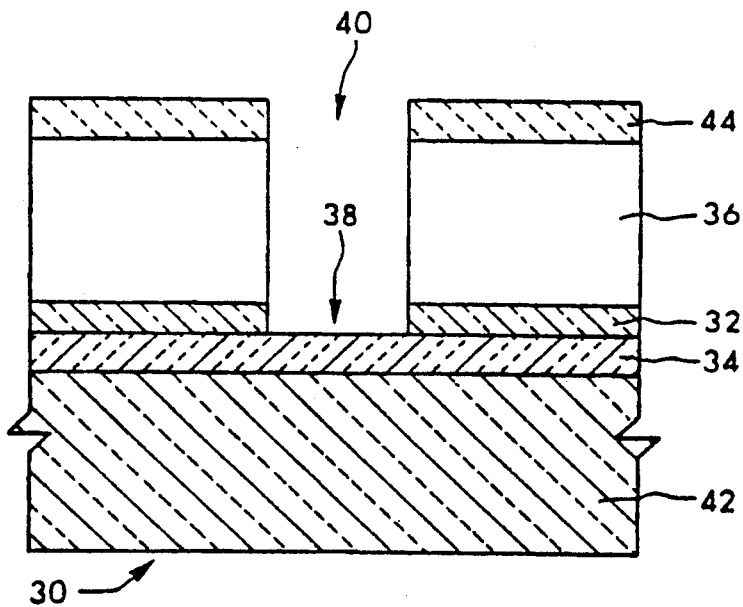
FIG. 4 is a cross-sectional view of the semiconductor device of FIGS. 2 and 3 after the etch of the poly layer which prevents CD loss.

Turning now to FIG. 4, after the nitride etch, the wafer 30 is etched in a second etch process fundamentally different than the first etch process to remove the polysilicon in the area 38. Preferably a plasma-enhanced chlorine dry etch is used, specifically chlorine ($Cl_2$) and hydrogen bromide (HBr). This is a fundamentally different etch than any etches for silicon nitride or silicon oxide. That is, the etch is based on chlorine chemistry rather than fluorine chemistry. Thus the selectivity for both the silicon nitride 36 and the oxide 34 can be extremely high. Thus this etch is made with virtually no CD loss. Further, since the poly etch is so highly selective to oxide 34, damage to the oxide 34 is negligible as compared to the prior art LOCOS process. Compare the oxide loss in FIG. 1 to that in FIG. 4.

In the preferred embodiment, the poly silicon layer 32 may generally range from about 100 Å thick (the vertical direction in the figures) to about 300 Å thick, and preferably is about 100 Å thick. It may be made even thinner than 100 Å as selectivity of the nitride etch to the polysilicon film are improved. In the specific preferred embodiment shown the width of area 40 is 0.3 μm ACI (After Clean Inspect) and the width of area 38 is also 0.3 μm ADI (After Development Inspect). This compares to the prior art LOCOS process in which the comparable dimensions were 0.40 μm to 0.45 μm ACI. The dimensions of the other parts of the invention are known by those skilled in the art.

A feature of the invention is that the layer of polysilicon 32 is very thin. The purpose of this layer 32 is essentially to allow different chemistries to be used to etch the nitride 36 and to expose the oxide 34. Thus the maximum thickness of the layer is only determined by the selectivity of the nitride etch for polysilicon.

A related feature of the invention is that the etches used to etch the nitride layer 36 and the etch used to etch the poly layer 32 are fundamentally different. That is, they are based on different etch chemistries. This permits a greater overall selectivity and results in negligible CD loss.

A further feature of the invention is that the etch chemistry for etching layer 32 is also fundamentally different than the etch chemistry for oxide. This not only leads to negligible CD loss, but means that the oxide layer 34 can be relatively thin and still effectively protect the silicon 42 beneath it from damage in the etching process.

There has been described a novel integrated circuit fabrication process which solves the CD loss problem in the standard LOCOS process with only a thin, about 100 Å thick poly silicon layer between the nitride and pad oxide. this considerably shortens the poly etch required as compared to the conventional PBL process as well as having many other advantages. It should be understood that the particular embodiment shown in the drawings and described within this specification is for purposes of example and should not be construed to limit the invention which will be described in the claims below. Further, it is evident that those skilled in the art may now make numerous uses and modifications of the specific embodiment described, without departing from the inventive concepts. For example, now that it is seen to be possible to solve the CD loss problem in the LOCOS technology by use of a thin poly layer 32, this solution can be used in other situations where there is a problem due to CD loss in nitride etches. Further, now that the advantages of etch chemistry differentiation in reducing CD loss have been shown, such differentiation can be used in other applications. As another example, the particular dimensions used in the preferred embodiment are not critical. A greater or lesser thickness of poly may be used. Consequently, the invention is to be construed as embracing each and every novel feature and novel combination of features present in and/or possessed by the semiconductor device described.

What is claimed is:

1. An integrated circuit fabrication process comprising the steps of:
   providing a layer of a first material;
   forming a layer of a second material having a thickness less than 300 angstroms determined only by the selectivity of said first etch process to said second material, said layer of second material covering said layer of a first material and having a fundamentally different etch chemistry from said first material;
   forming a layer of a third material covering said layer of a second material having an etch chemistry similar to the etch chemistry of said first material;
   patterning said third material using a first anisotropic etch process to remove portions of said third material to expose selected areas of said second material;
   removing the exposed areas of said second material using a second etch process having an etch chemistry fundamentally different from the chemistry of said first anisotropic etch process.

2. The process of claim 1 wherein said first material is silicon dioxide, said second material is polysilicon, and said third material is silicon nitride.

3. The process of claim 2 wherein said first anisotropic etch process is fluorine-based etch process and said second etch process is a chlorine-based etch process.

4. An integrated circuit fabrication process comprising the steps of:
   providing a silicon substrate;
   forming a layer silicon oxide on said silicon substrate;
   forming a layer of polysilicon less than 300 Å thick over said silicon oxide layer;

forming a silicon nitride layer over said polysilicon layer;

patterning said silicon nitride layer with a first anisotropic etch process to expose selected areas of said polysilicon layer;

removing said exposed areas of polysilicon using a second etch process fundamentally different from said first anisotropic etch process.

5. A process as in claim 4 wherein said first anisotropic etch process is fluorine-based etch process and said second etch process is a chlorine-based etch process.

6. An integrated circuit fabrication process comprising the steps of:

providing a layer of a first material;

forming a layer of a second material having a thickness of less than 300 angstroms covering said layer of first material and having a fundamentally different etch chemistry from said first material;

forming a layer of a third material covering said layer of second material and having an etch chemistry similar to the etch chemistry of said first material;

forming a patterned photoresist layer on said layer of a third material, said patterned photoresist layer including an opening that exposes selected areas of said third materials;

patterning said third material through said opening using a first etch process to remove said selected areas of said third material and to expose selected areas of said second material, wherein said first etch process does not isotropically etch the photoresist layer or substantially etch the second material layer;

removing the exposed areas of said second material through said opening using a second etch process having an etch chemistry fundamentally different from said first etch process.

7. The process of claim 6 wherein said layer of second material has a minimum thickness determined only by the selectivity of said first etch process to said second material.

8. An integrated circuit fabrication process comprising the steps of:

providing a semiconductor wafer;

forming a first layer comprising silicon oxide on the semiconductor wafer;

forming a second layer comprising a material having a fundamentally different etch chemistry from said first layer, wherein said second layer covers said first layer and is less than about 300 Å thick;

forming a third layer comprising silicon nitride covering said second layer, wherein said second layer has a fundamentally different etch chemistry from said third layer;

forming a photoresist layer covering said third layer;

removing a portion of the photoresist layer to expose selected areas of said third layer;

removing said selected areas of said third layer using a fluorine-based plasma-enhanced anisotropic etch process to expose selected portions of said second layer; and removing said selected portions of said second layer using a plasma-enhanced etch process based on one of the groups consisting of chlorine or hydrogen bromide.

9. The process of claim 8 wherein said second layer comprises polysilicon.

* * * * *